United States Patent [19]
Lofland et al.

[11] Patent Number: 5,966,287
[45] Date of Patent: Oct. 12, 1999

[54] CLIP ON HEAT EXCHANGER FOR A MEMORY MODULE AND ASSEMBLY METHOD

[75] Inventors: Steve Lofland; Lloyd L. Pollard, II, both of Portland, Oreg.

[73] Assignee: Intel Corporation, Santa Clara, Calif.

[21] Appl. No.: 08/992,617

[22] Filed: Dec. 17, 1997

[51] Int. Cl.⁶ ................................................ H05K 7/20
[52] U.S. Cl. ........................ 361/704; 361/710; 361/715
[58] Field of Search .................. 165/80.3, 185; 174/16.3; 257/718, 719, 726, 727; 361/704, 707, 709–711, 715–721

[56] References Cited

U.S. PATENT DOCUMENTS

| | | | |
|---|---|---|---|
| 5,109,318 | 4/1992 | Funari et al. | 361/710 |
| 5,473,511 | 12/1995 | Reddy et al. | 361/719 |
| 5,671,122 | 9/1997 | Schoettl et al. | 361/715 |

*Primary Examiner*—Gregory Thompson
*Attorney, Agent, or Firm*—Blakely, Sokoloff, Taylor & Zafman LLP

[57] ABSTRACT

An apparatus for dissipating heat generated by electronic components on a surface of a memory module and a method of assembling the apparatus are provided. The apparatus includes substantially identical first and second heat exchanger members, each having a heat spreader member thermally coupled to a heat sink member. The two heat exchanger members are positioned on opposing sides of a memory module and assembled together about the module. A surface of the heat spreader member is configured to engage electronic components on the surface of the memory module. A clip member protruding from an edge of each heat exchanger member is also provided. The first heat exchanger clip member is configured to engage an edge of the second heat exchanger member and the second heat exchanger clip is configured to engage an edge of the first heat exchanger member to releasably lock the first and second heat exchanger members together about the memory module.

20 Claims, 4 Drawing Sheets

CLIP ON HEAT EXCHANGER FOR A MEMORY MODULE AND ASSEMBLY METHOD

BACKGROUND OF THE INVENTION

1. Field of the Invention

This invention relates generally to heat exchangers, and more particularly, to an apparatus for dissipating heat generated by electronic components on a surface of a memory module.

2. Description of the Related Art

Memory devices that are currently in use do not generally require devices to dissipate heat. The electronic components on currently available 66 Mhz and below memory modules do not generate enough heat to require additional thermal enhancement. However, as the requirements for memory in the same or less amount of space increase, more electronic components, or higher density components, which generate more heat must be used. As the industry progresses toward SDRAM DIMM devices at 100 Mhz and above, the use of heat sinks will be required to remove the additional heat generated by the memory module. A heat sink device that is easy to install, and one that can be used with a variety of memory modules would be needed.

The present invention is directed to overcoming, or at least reducing the effects of, one or more of the problems set forth above.

SUMMARY OF THE INVENTION

In one aspect of the present invention, an apparatus for dissipating heat generated by electronic components on a surface of a memory module is provided. The apparatus includes a first heat exchanger member having an inner surface configured to engage electronic components on a first surface of the memory module, and a second heat exchanger member having an inner surface configured to engage a second surface of the memory module. Clip means are also provided for releasably securing the first and second heat exchanger members together about the memory module.

According to another aspect of the present invention, a method of assembling a heat exchanger about a memory module having electronic components positioned on at least one surface thereof is provided. According to the method, a first heat exchanger member is positioned adjacent a first side of the memory module such that an inner surface of the first heat exchanger member engages the electronic components on the first side of the memory module. A second heat exchanger member is positioned adjacent a second side of the memory module such that an inner surface of the second heat exchanger member engages the second surface of the memory module. A clip protruding from an edge of the first heat exchanger member is snapped into engagement with an edge of the second heat exchanger member. A clip member protruding from an edge of the second heat exchanger member is also snapped into engagement with an edge of the first heat exchanger member.

BRIEF DESCRIPTION OF THE DRAWINGS

Other objects and advantages of the invention will become apparent upon reading the following detailed description and upon reference to the drawings in which.

Figure 4:
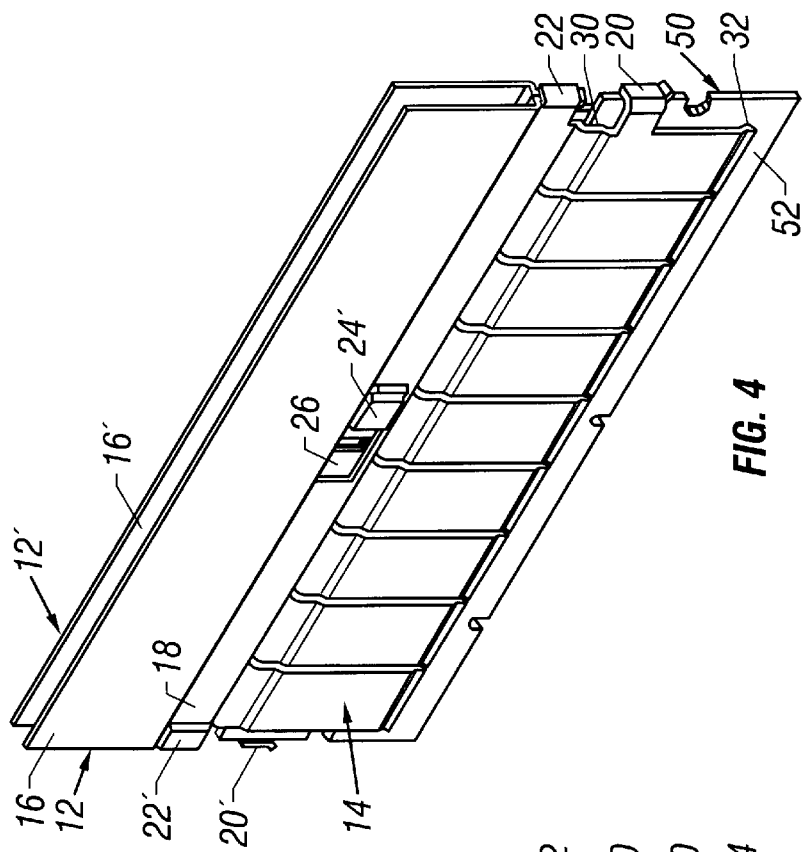
FIG. 4 is a perspective view of a clip-on heat sink assembly according to a second embodiment of the present invention, shown assembled about a memory module.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 1:
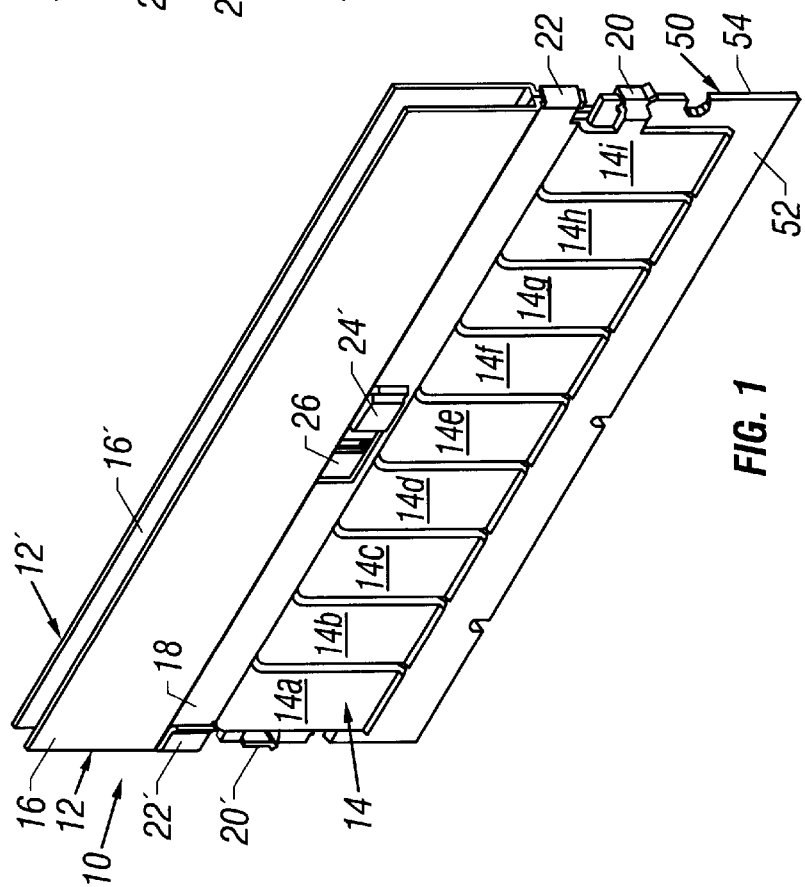
FIG. 1 is a perspective view of a clip-on heat sink assembly according to a first embodiment of the present invention, shown assembled about a memory module.
Figure 2:
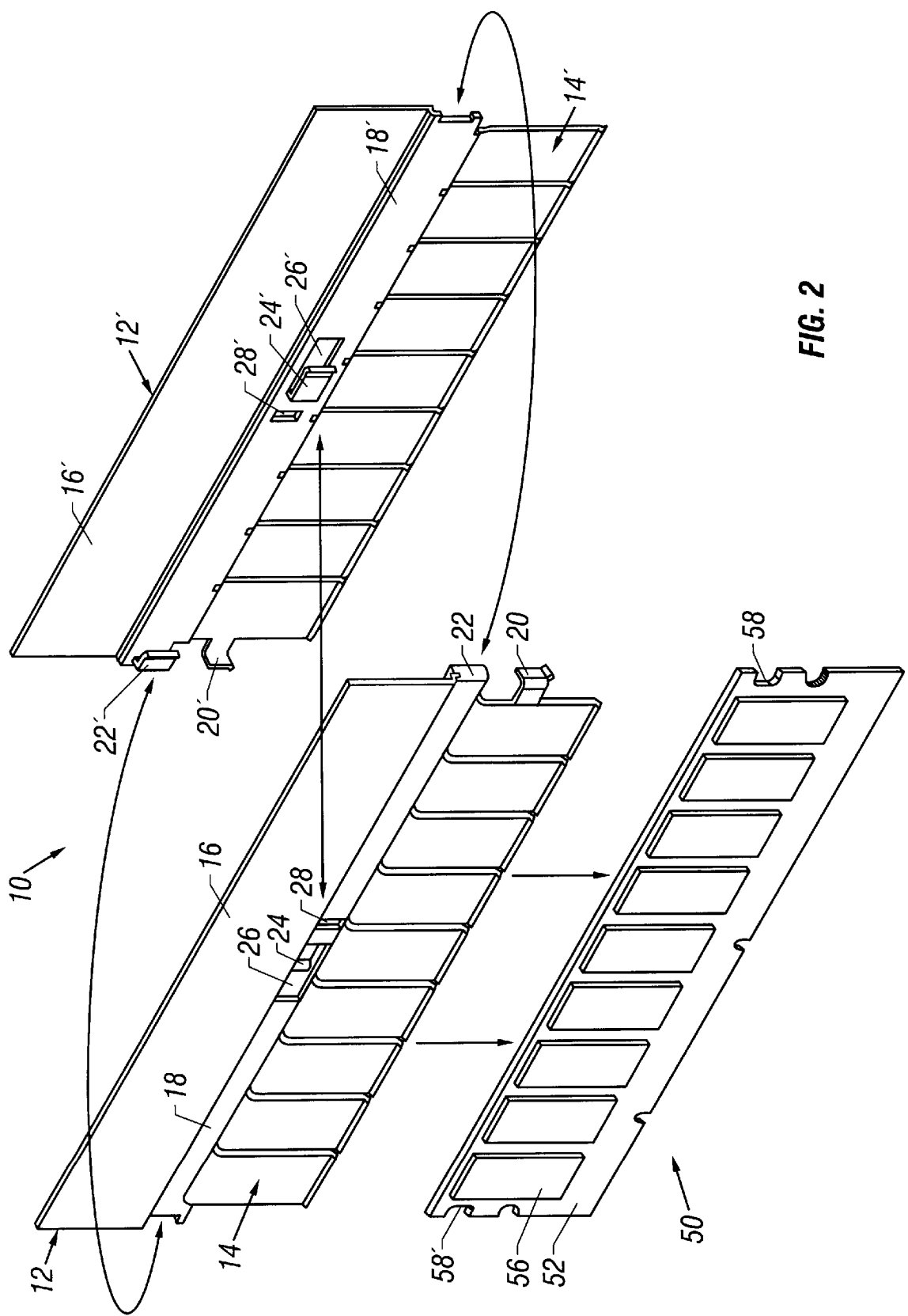
FIG. 2 is a perspective view of the clip-on heat sink assembly of FIG. 1, shown positioned adjacent, but not assembled to, the memory module.
Figure 3:
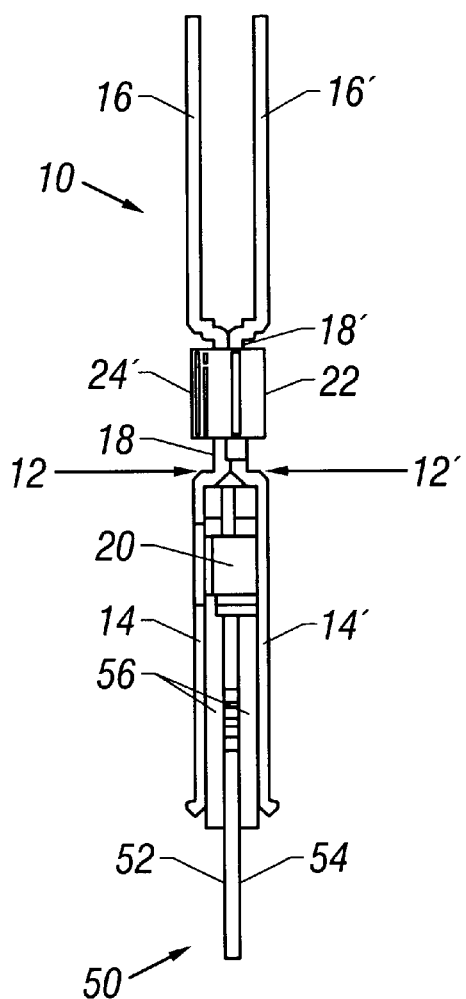
FIG. 3 is an end view in elevation of the clip-on heat sink assembly of FIG. 1, shown assembled about a memory module.

As shown in FIGS. 1–3, a clip-on heat exchanger 10 according to a first aspect of the invention may be assembled about a memory module 50, such as a DIMM (double-side in-line memory module), to remove heat generated by electronic components 56, such as SDRAM components, located on first and second surfaces 52, 54, respectively, of the memory module 50. The clip-on heat exchanger 10 includes first and second heat exchanger members 12, 12', which are substantially identical in structure. In the interest of brevity, only the features of the first heat exchanger member 12 will be discussed, with the understanding that the second heat exchanger member 12' exhibits identical features, unless otherwise noted herein.

The first heat exchanger member 12 includes a heat spreader member 14, which is thermally coupled to a heat sink member 16 through an intermediate member 18. As best shown in FIG. 3, the intermediate member 18 is offset from the heat spreader member 14 and heat sink member 16 to allow the memory module 50 to be inserted between the heat spreader members 14, 14' when the two members 12, 12' of the heat exchanger 10 are assembled. The offset between the intermediate member 18 and the heat sink member 16 also permits the heat sink members 16, 16' to be spaced apart from one another for better air flow, and thus better heat dissipation. Both heat exchanger members 12, 12' are constructed of a thermally conductive material, for example, aluminum.

A tab 20 protrudes from a side edge of the first heat exchanger member 12. The tab 20 is configured to engage and be retained in a notch 58 (FIG. 2) located in a side edge of the memory module 50. Similarly, the tab 20' of the second heat exchanger member 12' is configured to engage a notch 58' in the opposing side edge of the memory module, as best shown in FIG. 2. The tabs 20, 20' are retained in the notches 58, 58' to secure the heat exchanger 10 to the memory module 50 upon assembly.

As best shown in FIGS. 1 and 2, the heat spreader member 14 includes a plurality of fins 14a, 14b, . . . 14i. The number of fins can vary depending upon the configuration of electronic components 56 on the surface of the memory module 50. By way of example, FIGS. 1 and 2 show a memory module 50 having nine electronic components 56 on the surface 52 thereof. The heat spreader member 14 of FIGS. 1 and 2 also exhibits nine fins 14a–14i each configured to engage a surface of one of the electronic components 56. The use of the fins 14a–14i assures that good contact will be made between the heat spreader member 14 and each of the electronic components 56, particularly when components having different geometric configurations are used on the same memory module surface.

The intermediate portion 18 of the heat exchanger member 12 includes an end clip 22 extending from a first edge thereof. When assembled to the second heat exchanger member 12' the end clip 22 of the first heat exchanger member 12 engages a second free edge of the second heat exchange member 12', and the end clip 22' of the second heat exchanger member 12' engages a second free end of the first heat exchange member 12. A second clip 24 is also positioned substantially in the center region of the intermediate portion 18 of the heat exchanger member 12. An opening 26 is formed in the intermediate portion 18 about the second clip 24, and a slot 28 is formed in the intermediate portion 18 near the second clip 24. When the two heat exchanger members 12, 12' are assembled, the second clip 24 of the first heat exchanger member 12 passes through the slot 26' of the second heat exchanger member 12' and a projection on the end thereof snaps into the slot 28'. The second clip 24' of the second heat exchanger member 12' likewise passes through the slot 26 of the first heat exchanger member 12 and a projection on the end thereof snaps into the slot 28 to snap-fit the two heat exchanger members 12, 12' together. The second clips 24, 24' are flexible and spring loaded so that they may be inserted through the respective openings 26, 26' and engage the slots 28, 28' at the rear surface of the intermediate portion 18, 18' to hold the heat exchanger members 12, 12' together.

Figure 6:
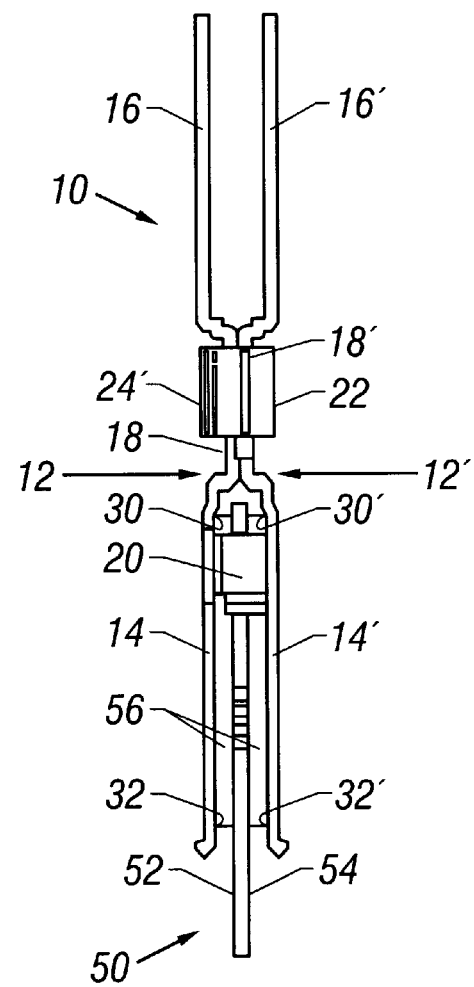
FIG. 6 is an end view in elevation of the clip-on heat sink assembly of FIG. 4, shown assembled about a memory module.
Figure 5:
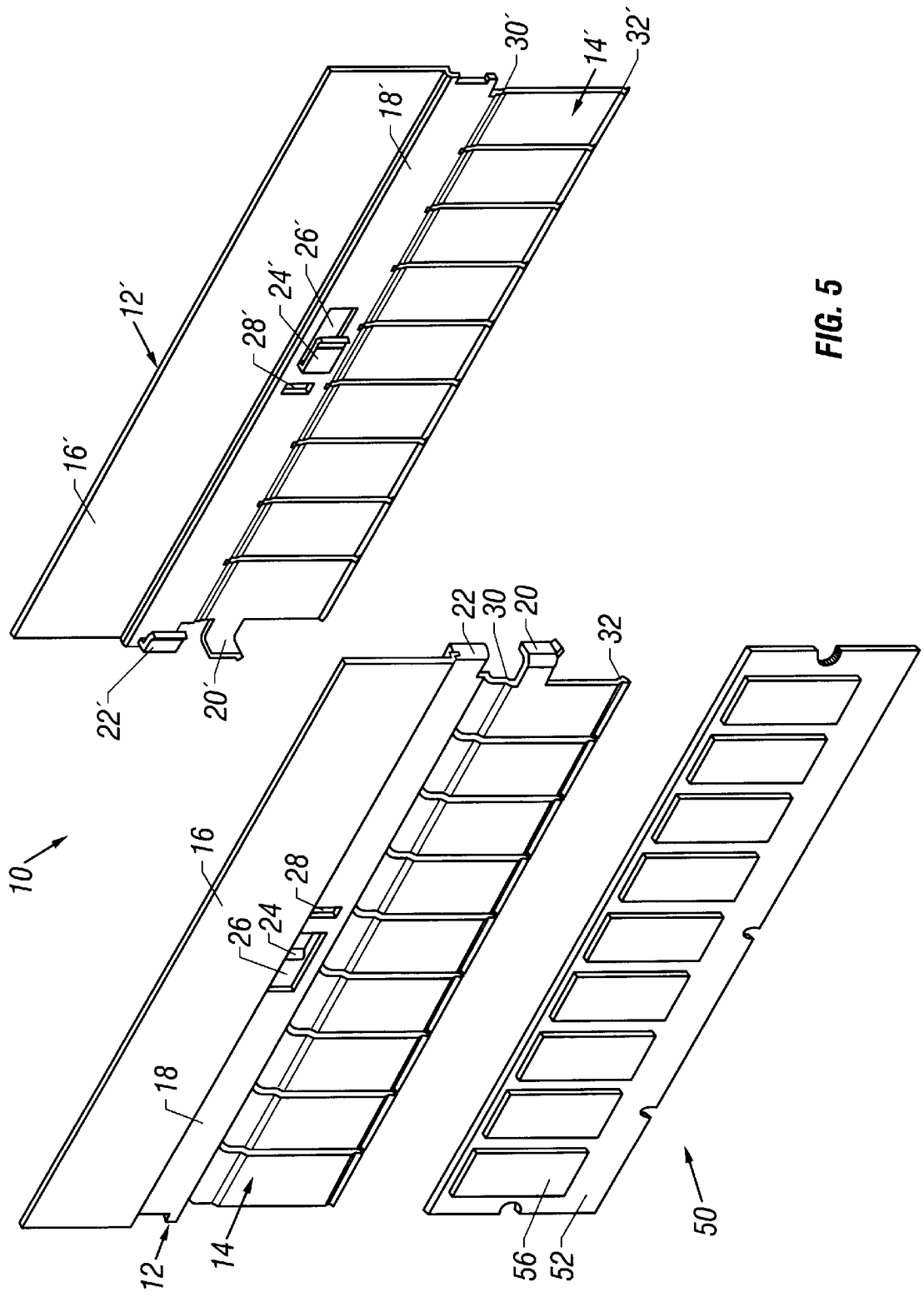
FIG. 5 is a perspective view of the clip-on heat sink assembly of FIG. 4, shown positioned adjacent, but not assembled to, the memory module.

The second embodiment of the present invention, shown in FIGS. 4–6, is substantially similar to the first embodiment discussed above, wherein like reference numerals indicate like components. However, the heat exchanger 10 according to the second embodiment may be secured to the memory module 50 in the absence of slots 58, 58' in the edges thereof. The heat exchanger 10 according to the second embodiment is secured to the memory module 50 by upper and lower lips 30, 32 located along the inner surface of the heat spreader member 14, 14' of each of the first and second heat exchanger members 12, 12'. The upper lip 30 engages an upper edge of the electronic component 56, while the lower lip 32 engages a lower edge of the electronic component 56, to secure the heat exchanger 10 to the memory module 50 when assembled.

Although the embodiments of the heat exchanger 10 are described above in relation to a DIMM component, it is also contemplated to use the heat exchanger 10 of the present invention to remove heat generated by components on the surface of a SIMM (single-side in-line memory module). When used in conjunction with a SIMM, the heat spreader member 14' will not engage electronic components on the back side of the module since none are present.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. An apparatus for dissipating heat generated by electronic components on a surface of a memory module, the apparatus comprising:

a first heat exchanger member having a heat spreader member thermally coupled to a heat sink member, said heat spreader member including at least one thermally conductive fin, said fin being configured to engage a surface of a corresponding electronic component on a first surface of the memory module, said first heat exchanger member also including a clip member protruding therefrom; and a second heat exchanger member having a heat spreader member thermally coupled to a heat sink member, a surface of the heat spreader member configured to engage a second surface of the memory module;

said first heat exchanger clip member configured to engage the second heat exchanger member to releasably lock the first and second heat exchanger members together about the memory module.

2. The apparatus for dissipating heat according to claim 1, wherein said thermally conductive fin includes lip regions configured to engage upper and lower edges of a corresponding electronic component.

3. The apparatus for dissipating heat according to claim 1, wherein the heat spreader member of the second heat exchanger member includes at least one thermally conductive fin, said fin being configured to engage a surface of a corresponding electronic component on the second surface of the memory module.

4. The apparatus for dissipating heat according to claim 3, wherein said thermally conductive fin on the heat spreader members of said first and second heat exchanger members includes lip regions configured to engage upper and lower edges of a corresponding electronic component.

5. The apparatus for dissipating heat according to claim 1, wherein the first heat exchanger member includes a tab projecting from a side end thereof, said tab configured to engage a notch in a side edge of the memory module.

6. The apparatus for dissipating heat according to claim 1, wherein each of the first and second heat exchanger members includes a tab projecting from a side end thereof, said tab of the first heat exchanger member configured to engage a notch in a first side edge of the memory module and said tab of the second heat exchanger member configured to engage a notch in a second opposing side edge of the memory module.

7. The apparatus for dissipating heat according to claim 1, wherein said clip is positioned on an inner surface thereof, and said second heat exchanger member includes an opening formed therein, said opening configured to releasably receive the clip from the first heat exchanger member when the apparatus is assembled.

8. The apparatus for dissipating heat according to claim 1, wherein said clip is an end clip positioned along a side edge of the first heat exchanger member and configured to engage an opposing side edge of the second heat exchanger member.

9. The apparatus for dissipating heat according to claim 8, further comprising an end clip positioned along a side edge of the second heat exchanger member and configured to engage an opposing side edge of the first heat exchanger member.

10. The apparatus for dissipating heat according to claim 9, further comprising a second clip positioned on an inner surface of said first heat exchanger member, and an opening formed in said second heat exchanger member configured to releasably receive said second clip of the first heat exchanger member.

11. The apparatus for dissipating heat according to claim 10, further comprising a second clip positioned on an inner surface of said second heat exchanger member, and an opening formed in said first heat exchanger member configured to releasably receive said second clip of the second heat exchanger member.

12. An apparatus for dissipating heat generated by electronic components on a surface of a memory module, the apparatus comprising:

a first heat exchanger member having at least one thermally conductive fin, said fin being configured to engage a surface of a corresponding electronic component on a first surface of the memory module;

a second heat exchanger member having an inner surface configured to engage a second surface of the memory module; and means for releasably securing the first and second heat exchanger members together about the memory module.

13. The apparatus for dissipating heat according to claim 12, further comprising means for securing the first and second heat exchanger members to the memory module.

14. A method of assembling a heat exchanger about a memory module having electronic components positioned on at least one surface thereof, said method comprising:

positioning a first heat exchanger member adjacent a first side of the memory module such that an inner surface of one or more thermally conductive fins of the first heat exchanger member engages with a corresponding one or more electronic components on the first side of the memory module;

positioning a second heat exchanger member adjacent a second side of the memory module such that an inner surface of the second heat exchanger member engages the second surface of the memory module; and snapping a clip protruding from the first heat exchanger member into engagement with the second heat exchanger member.

15. The method of assembling a heat exchanger according to claim 14, further comprising snapping a clip member protruding from an edge of the second heat exchanger member into engagement with an edge of the first heat exchanger member.

16. The method of assembling a heat exchanger according to claim 14, further comprising inserting a tab protruding from an edge of the first heat exchanger member into a first slot formed in a side edge of the memory module.

17. The method of assembling a heat exchanger according to claim 16, further comprising inserting a tab protruding from an edge of the second heat exchanger member into a second slot formed in a side edge of the memory module.

18. The method of assembling a heat exchanger according to claim 14, further comprising engaging the top and bottom edges of each electronic component with lip regions on the surface of each thermally conductive fin.

19. The method of assembling a heat exchanger according to claim 14, wherein the step of positioning the second heat exchanger member comprises aligning one or more thermally conductive fins on the inner surface of the second heat exchanger member with a corresponding one or more electronic components.

20. The method of assembling a heat exchanger according to claim 19, further comprising engaging the top and bottom edges of each electronic component with lip regions on the surface of each thermally conductive fin.

\* \* \* \* \*